United States Patent
Wan et al.

(10) Patent No.: US 7,095,226 B2
(45) Date of Patent: Aug. 22, 2006

(54) VERTICAL DIE CHIP-ON-BOARD

(75) Inventors: Hong Wan, Plymouth, MN (US); Ronald J. Jensen, Bloomington, MN (US); Michael J. Bohlinger, Minnetonka, MN (US); Tamara K. Bratland, Plymouth, MN (US)

(73) Assignee: Honeywell International, Inc., Morristown, NJ (US)

( * ) Notice: Subject to any disclaimer, the term of this patent is extended or adjusted under 35 U.S.C. 154(b) by 162 days.

(21) Appl. No.: 10/789,682

(22) Filed: Feb. 27, 2004

(65) Prior Publication Data

US 2005/0122100 A1    Jun. 9, 2005

Related U.S. Application Data

(60) Provisional application No. 60/527,368, filed on Dec. 4, 2003.

(51) Int. Cl.
*G01R 33/02* (2006.01)
*G01R 33/00* (2006.01)

(52) U.S. Cl. ................................ 324/247; 324/260

(58) Field of Classification Search ............... 324/253, 324/245, 260, 244, 247, 251, 252, 249, 258, 324/254; 33/319, 366.12; 228/32 R, 32 H
See application file for complete search history.

(56) References Cited

U.S. PATENT DOCUMENTS

| | | | |
|---|---|---|---|
| 3,304,787 A * | 2/1967 | Chiku et al. ............. 73/514.33 |
| 5,583,436 A * | 12/1996 | Van De Walle et al. .... 324/252 |
| 5,689,185 A * | 11/1997 | Widdershoven et al. .... 324/252 |
| 5,833,608 A * | 11/1998 | Acker ......................... 600/409 |
| 5,850,624 A | 12/1998 | Gard et al. ................... 702/92 |
| 5,953,683 A * | 9/1999 | Hansen et al. ................ 702/95 |

(Continued)

FOREIGN PATENT DOCUMENTS

JP       363158477 A *  7/1988 ................ 324/251

(Continued)

OTHER PUBLICATIONS

Van Zant, Microchip Fabrication, 4th Edition; McGraw-Hill (2000); Chapter 18, pp. 557-593.

(Continued)

*Primary Examiner*—Bot Ledynh
*Assistant Examiner*—Kenneth Spike Whittington
(74) *Attorney, Agent, or Firm*—McDonnell Boehnen Hulbert & Berghoff LLP

(57) ABSTRACT

Methods and apparatus for vertical chip-on-board sensor packages can comprise a vertical sensor circuit component comprising a first face, a second face, a bottom edge, a top edge, two side edges, input/output (I/O) pads and at least one sensitive direction wherein the I/O pads are arranged near the bottom edge. Such vertical die chip-on-board sensor packages can also comprise one or more horizontal sensor circuit components comprising a top face, a printed circuit board (PCB) mounting face, a vertical sensor circuit component interface edge, two or more other edges, and one or more sensitive directions wherein the vertical sensor circuit component interface edge supports the vertical sensor circuit component along the Z axis and conductively or non-conductively connects to the vertical sensor circuit component. The methods and apparatus provided include a multi-axis magnetometer for measuring the magnetic field intensity along three orthogonal axes comprising one or more magnetic field sensing circuit components mounted by their PCB mounting face to a PCB and a vertical magnetic sensor circuit component mounted to the PCB such that the vertical magnetic sensor circuit component is attached to and supported by the magnetic field sensing circuit component.

31 Claims, 10 Drawing Sheets

U.S. PATENT DOCUMENTS

| | | | |
|---|---|---|---|
| 6,107,801 A * | 8/2000 | Hopwood et al. | 324/326 |
| 6,243,660 B1 * | 6/2001 | Hsu et al. | 702/160 |
| 6,304,082 B1 | 10/2001 | Gualtieri et al. | 324/252 |
| 6,504,366 B1 * | 1/2003 | Bodin et al. | 324/247 |
| 2002/0140422 A1 | 10/2002 | Bodin et al. | 324/247 |
| 2002/0167308 A1 | 11/2002 | Davis | 324/207.15 |
| 2005/0017714 A1 * | 1/2005 | Beichler et al. | 324/247 |

FOREIGN PATENT DOCUMENTS

| | | | | |
|---|---|---|---|---|
| JP | 402085785 A | * | 3/1990 | 324/244 |
| WO | WO 00/37952 | | 6/2000 | |

OTHER PUBLICATIONS

International Search Report dated Jun. 17, 2005.

* cited by examiner

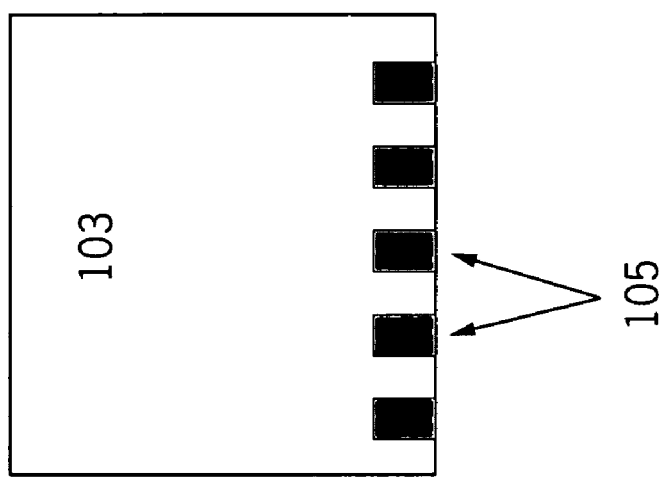
FIG. 3 (II)

VERTICAL DIE CHIP-ON-BOARD

PRIORITY

This utility application claims priority to U.S. Provisional Patent Application Ser. No. 60/527,368, filed Dec. 4, 2003, the disclosure of which is expressly incorporated herein by reference.

FIELD

The present invention relates generally to methods of manufacturing sensors and sensors produced by such methods. More specifically, the present invention relates to the design and manufacture of low-profile multi-axis sensors, for example, magnetic and tilt sensors.

BACKGROUND

The Earth's magnetic field intensity is about 0.5 to 0.6 gauss and has a component parallel to the Earth's surface that always points toward magnetic north. This field can be approximated with a dipole model—the field always points north, but the angle of the field relative to the surface of the Earth changes from horizontal at the equator to sub-horizontal (i.e., "down" toward the ground) in the northern hemisphere and supra-horizontal (i.e., "up" toward the air) in the southern hemisphere. In all cases, the horizontal direction of the Earth's field points toward magnetic north and is used to determine compass direction.

Magnetic sensors have been in use for well over 2,000 years, primarily used to sense the Earth's magnetic field for direction finding or navigation. Today, magnetic sensors are still a primary means of navigation and many other uses have evolved. As a result, magnetic sensors may be found in medical, laboratory, and electronic instruments; weather buoys; virtual reality systems; and a variety of other systems.

Modern consumer and commercial electronic equipment design has generally involved the consolidation of numerous disparate functions into a single device and the evolution of devices of increasingly diminutive scale. Small devices and devices that incorporate numerous functions require their internal components to be as small as possible. The desire to incorporate wayfinding and navigation technology into such compact devices requires the requisite 2- and 3-dimensional sensors, for example magnetic sensors and/or tilt sensors, to be of minimum height in the Z-axis (i.e., out of the plane of the printed circuit board (PCB)). Mounting a vertical sensor along the Z-axis is a challenge for the semiconductor assembly industry, especially for applications that have space limitations. Current methods fail to mount vertical (Z-axis) sensors for applications with limited space and cost sensitive, high volume, standard PCB processes.

Therefore, a need exists for mounting sensors orthogonally to other sensors mounted in the plane of a printed circuit board, said orthogonally mounted sensors measuring forces or magnetic fields on the Z-axis. In particular, a need exists for mounting of orthogonal sensors in a low profile manner in, for example, cell phone and other consumer and commercial applications. Such needs should be filled by applications that are cost sensitive, high volume, and easily adaptable to common PCB assembly processes.

SUMMARY OF THE INVENTION

In one aspect of the invention, a sensor package is provided comprising a vertical sensor circuit component and a horizontal sensor circuit component. The vertical sensor circuit component comprises a first face, a second face, a bottom edge, a top edge, two side edges, input/output (I/O) pads and a sensitive direction, and the I/O pads are arranged on the second face of the vertical sensor circuit component and the sensitive direction can be perpendicular to the I/O pads arranged proximal to said bottom edge. In certain embodiments, the I/O pads are arranged in an array. The horizontal sensor circuit component comprises a top face, a printed circuit board (PCB) mounting face, a vertical sensor circuit component interface edge, at least two or more other edges, and one or more sensitive directions orthogonal to the sensitive direction of the vertical sensor circuit component. In this aspect of the invention, the vertical sensor circuit component interface edge of the horizontal sensor circuit component connectively supports the vertical sensor circuit component along the Z axis.

In certain embodiments of the invention, the distance between the bottom edge and the top edge of the vertical sensor circuit component is about 1.1 mm. In other embodiments, the distance between the bottom edge and the top edge of the vertical sensor circuit component or less that about 1.1 mm.

The I/O pads on the vertical sensor circuit component are preferably compatible with a method selected from the group consisting of wire bonding, flip chip, solder bumping, stud bumping, conductive epoxy, and flexible interconnect bonding, e.g., tape automated bonding (TAB), techniques. In other embodiments, the vertical sensor circuit component can comprise I/O pads on the first face for conductive connection to a horizontal sensor circuit component, and said I/O pads are preferably compatible with a method selected from the group consisting of wire bonding, flip chip, solder bumping, stud bumping, conductive epoxy, and flexible interconnect bonding, e.g., tape automated bonding (TAB), techniques. As such, the vertical sensor circuit component can be conductively connected to the horizontal sensor circuit component in certain embodiments.

In still other embodiments, the vertical sensor circuit component and the horizontal sensor circuit component are solid state sensors, while in other embodiments the sensor circuit components are magnetic sensors. In still other embodiments, the one or more vertical sensor circuit components and the one or more horizontal sensor circuit components are tilt sensors. In still other embodiments, one or more vertical sensor components can be one kind of sensor, for example, magnetic or tilt sensors, and the one or more horizontal sensor circuit component can be a sensor of a different kind, for example, a solid state chip that can provide a vertical support edge. In still other embodiments, the one or more vertical sensor components can be any kind of sensor, for example, magnetic or tilt sensors, and the one or more horizontal sensor circuit component can be any solid state chip, whether or not it is an actual sensor, provided it comprises a vertical sensor circuit component interface edge that can provide support for the vertical sensor circuit component.

In a second aspect of the invention, a method for mounting a vertical sensor circuit component is provided. The vertical sensor circuit component comprises a first and second face, a bottom, a top and two side edges, and I/O pads arranged on the second face to a PCB. The method comprises connecting the bottom edge of the vertical sensor circuit component to the PCB and connecting the first face of the vertical sensor circuit component to a vertical sensor circuit component interface edge of one or more horizontal sensor circuit components with a top face, a PCB mounting face, a vertical sensor circuit component interface edge, and at least two other edges connected to the PCB. The vertical sensor circuit component can be mounted such that the vertical sensor circuit component interface edge of the horizontal sensor circuit component supports the vertical sensor circuit component along the Z axis.

In certain embodiments, the vertical sensor circuit component is conductively connected to the PCB by a method selected from the group consisting of wire bonding, flip chip, solder bumping, stud bumping, conductive epoxy, and flexible interconnect bonding, e.g., tape automated bonding (TAB), techniques. In other embodiments, of the method, the vertical sensor circuit component is conductively connected to the PCB by conductive epoxy, solder bumping or stud bumping techniques. In some embodiments of the invention, the vertical sensor circuit component and the one or more horizontal sensor components are diced such that the edges are substantially perpendicular to the faces.

In a third aspect of the invention, a method for making a multi-axis magnetometer for measuring the magnetic field intensity along at least two orthogonal axes is provided. The method comprises mounting one or more magnetic field sensing circuit components comprising a top face, a PCB mounting face, a vertical magnetic sensor circuit component interface edge, and two or more other edges, by their PCB mounting face to a PCB and mounting to the PCB a vertical magnetic sensor circuit component comprising a first face, a second face, a bottom edge, a top edge, two side edges, input/output (I/O) pads and a sensitive direction wherein the I/O pads are arranged on the second face of the vertical sensor circuit component and the sensitive direction can be orthogonal to the I/O pads arranged proximal to the bottom edge. In this method, the vertical magnetic sensor circuit component is attached to and supported by the magnetic field sensing circuit component.

In some embodiments, the one or more magnetic field sensing circuit components are horizontal sensor circuit components, while in other embodiments are one or more horizontal, 1-dimensional sensor circuit components. The vertical magnetic sensing circuit component can be conductively or non-conductively connected to the magnetic field sensing circuit component, and a conductive connection can be formed by, for example, a conductive epoxy or adhesive, while a non-conductive connection can be formed with an adhesive, such as non-conductive epoxy.

In a fourth aspect of the invention, a multi-axis magnetometer for measuring the magnetic field intensity along at least two orthogonal axes is provided. The multi-axis magnetometer is produced according to the method of the third aspect of the invention, described above. In some embodiments, the multi-axis magnetometer further comprises a tilt sensor. With or without the tilt sensor, the multi-axis magnetometer for measuring the magnetic field intensity along three orthogonal axes can comprise a vertical magnetic sensor circuit component of about 1.1 mm in height above the PCB. Similarly, in alternative embodiments, either with or without a tilt sensor, the vertical magnetic sensor circuit component is less than about 1.1 mm in height above the PCB.

BRIEF DESCRIPTION OF THE DRAWINGS

An exemplary embodiment of the present invention is described below with reference to the drawings.

DETAILED DESCRIPTION

Preferred embodiments of the present invention will be described in detail with reference to the attached drawings, which are merely exemplary embodiments. With respect to FIG. 1, there is illustrated the construction of a three-axis sensor of the invention designated generally by the reference number 100. The three-axis sensor includes a printed circuit board (PCB) 101 to which sensor circuit components (i.e., sensors) are attached. A horizontal sensor circuit component 102, for example a magnetoresistive or Hall effect material assembled into an integrated circuit package or utilized as a bare die, is mounted to the PCB 101 using standard chip-on-board techniques such as wire bonding, flip chip, and flexible interconnect bonding. See, for example, Van Zant, *Microchip Fabrication*, 4$^{th}$ Edition; McGraw-Hill (2000); Chapter 18, pp. 557–593; the disclosure of this reference is incorporated by reference. Generally, sensors, as shown in 102, 103, and 204, are referred to "sensor circuit components," with more specific descriptors added as necessary; for example, a magnetic field sensor circuit component is a sensor circuit component sensitive to magnetic fields. Other sensor components described herein can also mount to a PCB 101 utilizing the same standard chip-on-board techniques. Preferably the horizontal sensor circuit component 102 is diced such that it possesses generally vertical edges along its thickness. An edge along the thickness of the horizontal sensor circuit component 102 serves as a support for a vertical sensor circuit component 103 mounted orthogonally to the horizontal sensor circuit component 102. With this in mind, as used herein the terms "sensors" and "horizontal sensor circuit components" also comprise, for example, solid state chips that possess no "sensing" ability per se but comprise a vertical edge along its thickness (a "vertical sensor circuit component interface edge") that can provide physical support to a sensor, such as a magnetic sensor, that is mounted vertically on a PCB. An exemplary embodiment is a two-axis magnetic sensor that comprises a two-axis magnetic sensor mounted vertically on the PCB, wherein the vertically mounted magnetic sensor is mounted against any generic (sensing or non-sensing) solid state chip on the PCB. The solid state chip or chips need only comprise a vertical sensor circuit component interface edge that can serve as a support for the vertical sensor in the vertical axis.

Figure 1:
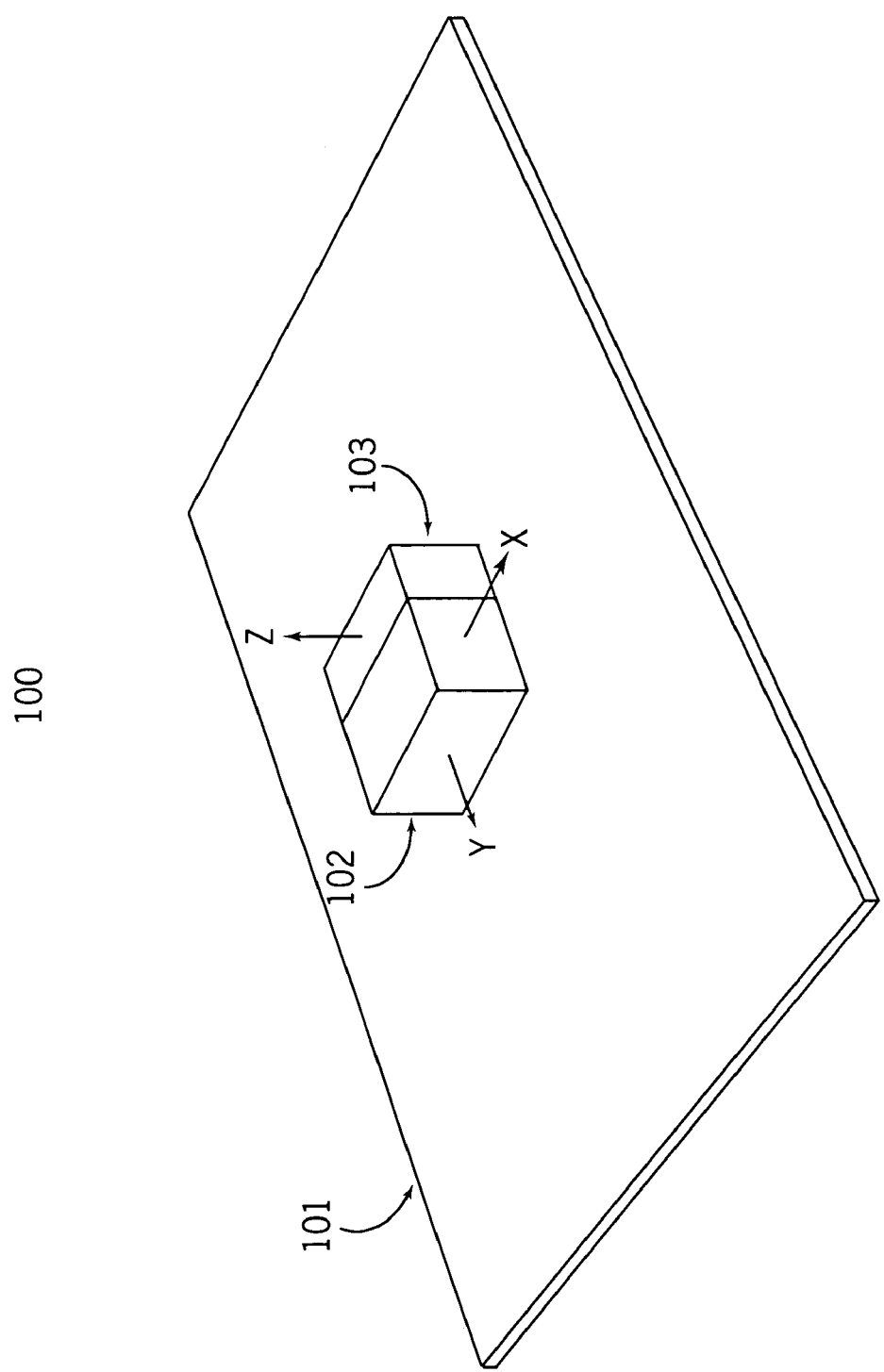
FIG. 1 is a schematic diagram of a vertical die chip-on-board sensor package according to an exemplary embodiment comprising a 2-axis magnetic sensor in the X-Y plane and a 1-axis magnetic sensor in the Z plane.

In the exemplary embodiment of FIG. 1, the horizontal sensor circuit component 102 are sensitive to forces, for example, magnetic forces, along the X and Y-axes, i.e., the axes that define the plane of the PCB 101. In this example, the vertical sensor circuit component 103 is sensitive to forces along the remaining orthogonal axis, the Z-axis. Thus, in this exemplary figure, the horizontal sensor circuit component 102 is a 2-dimensional sensor. It is contemplated that additional circuitry would be mounted on the PCB 101, which is independent from any attached sensor circuit components or which acts in concert with any attached sensor circuit components. A first and second sensor circuit components, be they vertical or horizontal, can be conductively or non-conductively connected to each other, as illustrated in FIG. 3 through FIG. 7. in addition, while FIGS. 1–4 illustrate the horizontal sensor circuit components as equal in height, no such limitation is implied. Generally, the vertical sensor circuit component is taller along the Z axis than the horizontal sensor circuit component, but both components may be of the same height or the horizontal sensor circuit component can be taller. However, the height of the sensor package is preferably about 1.1 mm or less.

According to the exemplary embodiment of the invention illustrated in FIG. 1, the angular orientations of the individual horizontal sensor circuit component 102 and vertical sensor circuit component 103 are positioned to sense and measure accurately the three orthogonal components of an external magnetic field along three dimensions or axes, i.e., the X, Y and Z axes. In this exemplary embodiment, such positioning can involve ensuring the vertical sensor circuit component 103 is mounted at an angle normal, or perpendicular, to the horizontal sensor circuit component 102. In preferred embodiments of this aspect of the invention, the vertical sensor circuit component 103, and hence the combined sensor package of vertical and horizontal sensor circuit components, is low-profile, or about 1.1 mm in height or less. Further, the horizontal and vertical sensor circuit components generally comprise electrical connections, for example, input/output (I/O) pads for, among any suitable connection technologies, solder bumping or stud bumping, on the surface that mounts to the PCB 101 and, in certain embodiments, to other sensor circuit components. Other chip-on-board techniques can be used to establish electrical connections between the PCB and sensor circuit components.

Figure 2:
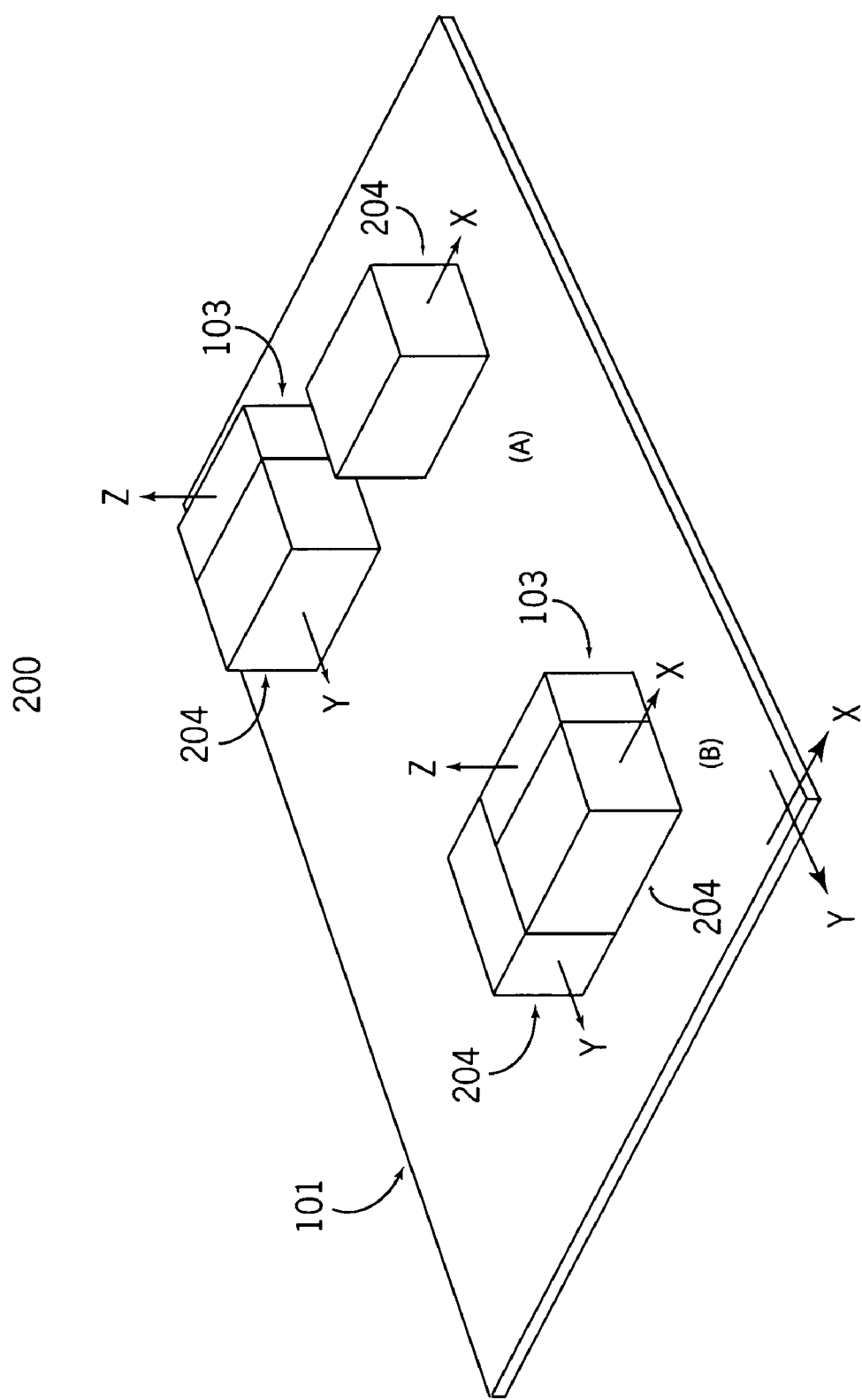
FIG. 2 is a schematic diagram of two different configurations of a vertical die chip-on-board sensor package according to exemplary embodiments comprising a 1-axis magnetic sensor in the X plane, a 1-axis magnetic sensor in the Y plane, and a 1-axis magnetic sensor in the Z plane mounted according to the invention.

FIG. 2 illustrates two alternate constructions of a three-axis sensor package made according to the methods of the invention, designated generally by the reference number 200. In the exemplary embodiments of FIG. 2, the sensor package comprises at least three main components, a first and second horizontal, 1-dimensional, sensor circuit component 204, and a vertical sensor circuit component 103. As used herein, a "horizontal, 1-dimensional, sensor circuit component" refers to a sensor that is sensitive to forces along a single axis. In FIG. 2, the first and second horizontal, 1-dimensional, sensor circuit components 204 are mounted so that each is sensitive to forces on the plane of the PCB orthogonal to the other.

Section A of FIG. 2 illustrates a sensor package wherein two horizontal, 1-dimensional, sensor circuit components are mounted separately in space on the PCB, with only one of the two sensor circuit components serving as a support for the vertical sensor circuit component 103. Section B of FIG. 2 illustrates a sensor package wherein the two horizontal, 1-dimensional, sensor circuit components 204 are in contact, conductively or non-conductively attached, with both serving as a support for the vertical sensor circuit component 103.

The horizontal, 1-dimensional, sensor circuit components can also be mounted in a sensor package wherein the horizontal sensor circuit components 204 are in conductive or non-conductive contact, but only one of the horizontal 1-dimensional sensor circuit components serves as a support for the vertical sensor circuit component 103. In alternate embodiments of the invention, the vertical sensor circuit component can be mounted vertically but be sensitive to forces along one or more axes other than the Z axis. That is, any of the vertical and horizontal sensor circuit components utilized to form sensor packages of the invention can be sensitive to forces along one or more axes.

Horizontal, 1-dimensional, sensor circuit components 204 (as well as "first sensor circuit components," 102) generally have electrical connections, for example, input/output (I/O) pads, for example, for solder bumping or stud bumping, on at least the surface that mounts to the PCB 101. Horizontal, 1-dimensional, sensor circuit components 204 (as well as vertical sensor circuit components 103) can also have electrical connections, such as I/O pads, on surfaces other than those interfacing with the PCB to facilitate extra-PCB electrical connection, such as, for example, between sensor circuit components. Other chip-on-board techniques can be used to establish electrical connections.

As with the three-axis sensor 100 of FIG. 1, an edge along the thickness of one or more horizontal, 1-dimensional, sensor circuit components (204) serves as a support for the vertical sensor circuit component 103 mounted orthogonally to one or more of the horizontal, 1-dimensional, sensor circuit components 204. Preferably the horizontal, 1-dimensional, sensor circuit components 204 are diced such that they possess generally vertical edges along their thicknesses to support the vertically-mounted sensor circuit component 103 to which they are conductively or non-conductively connected.

Horizontal, 1-dimensional, sensor circuit components 204 can be substantially similar to a vertical sensor circuit component 103, except that the vertical component generally mounts to the PCB 101 along the thickness, or an edge, of the sensor rather than on its face, i.e., it mounts vertically. Such vertical sensor circuit components generally have any electrical connections (for example, I/O pads for solder bumping or stud bumping or bonding pads for wire bonding) on at least a face of the sensor, generally near the edge that mounts to the PCB 101. Preferably, I/O pads are arranged as an array, and the array can be perpendicular to a sensitive direction of the sensor. See also FIG. 7 for an exemplary embodiment. Vertical sensor circuit components can comprise sensors sensitive to forces along a single axis and can thus be referred to as "vertical, 1-dimensional, sensor circuit components" in such embodiments. In other embodiments, vertical sensor circuit components are sensitive to forces in more than one direction, along any of the X, Y or Z axes.

According to exemplary embodiments A and B of the invention illustrated in FIG. 2, the angular orientations of the individual first and second horizontal, 1-dimensional, sensor circuit components 204 and vertical sensor circuit components 103 are adjusted to sense and measure accurately the three orthogonal components of an external magnetic field along three dimensions or axes, i.e., the X, Y and Z axes. In preferred embodiments of this aspect of the invention, the vertical sensor circuit component 103 is low profile, or less than about 1.1 mm in height. In alternate embodiments, vertical die chip-on-board sensor packages can be made that are sensitive to forces along less than three axes. Utilizing FIG. 2 as an example, one horizontal, 1-dimensional, sensor circuit component 204 can be omitted, leaving the remaining horizontal sensor circuit component 204 and vertical sensor circuit component 103 to be mounted according to the methods of the invention.

Figure 3:
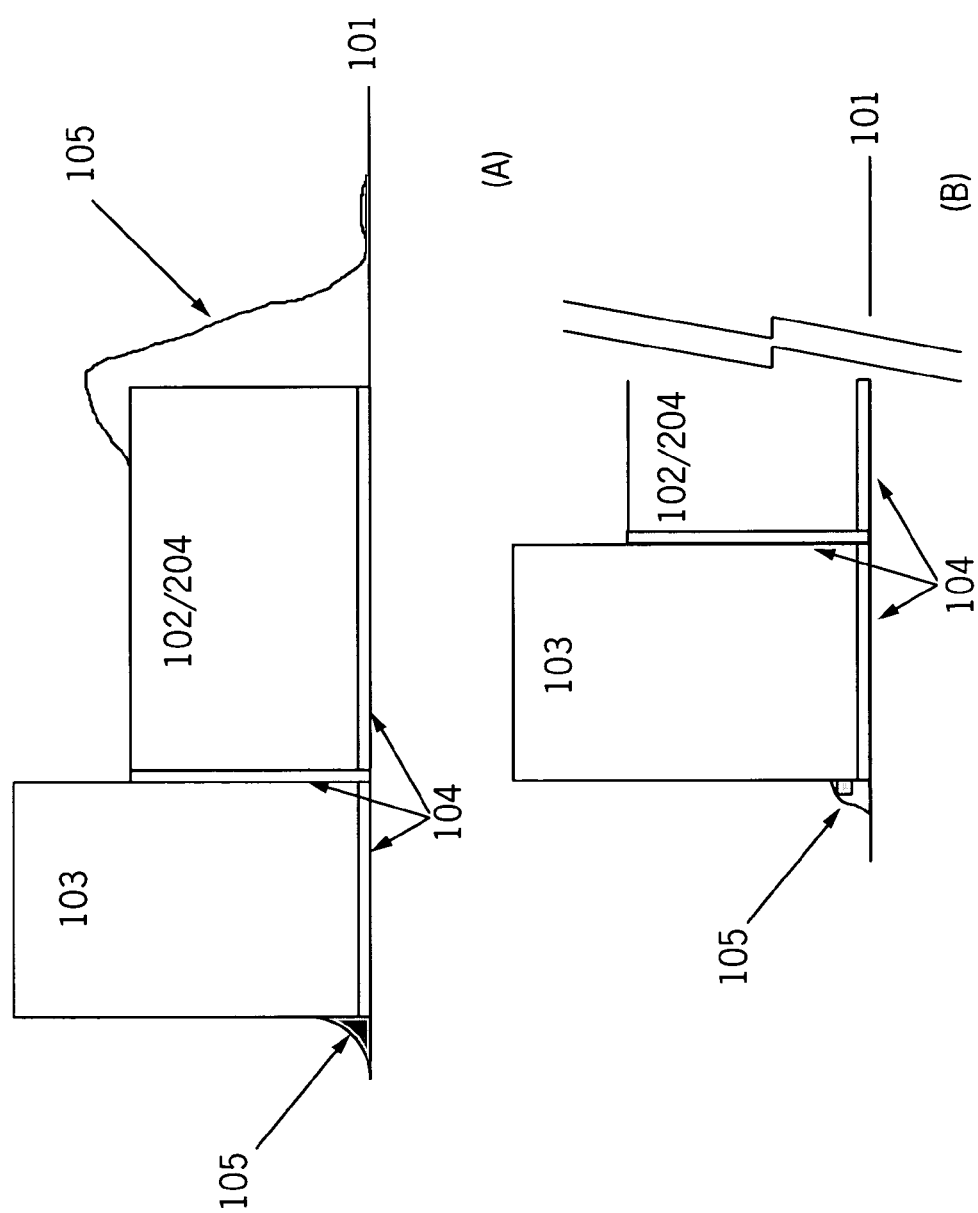
FIG. 3 presents front and side view schematic diagrams of a vertical die chip-on-board sensor packages and demonstrates exemplary methods of attachment between the vertical sensor, horizontal sensor and the PCB.

FIG. 3 represents front and side views schematic diagrams of a vertical die chip-on-board sensor packages and demonstrates exemplary methods of attachment between the vertical sensor circuit component 103, horizontal sensor circuit component 102, 204 and the PCB 101. FIG. 3 can comprise, for example, a three-axis sensor 100 of FIG. 1 or one or more horizontal, 1-dimensional, sensor circuit component 204 and a vertical sensor circuit component 103 of FIG. 2. The sensor package, for example a magnetic sensor, includes a PCB 101 to which sensor circuit components are attached. A horizontal sensor circuit component 102 or a horizontal, 1-dimensional, sensor circuit component 204 is mounted to the PCB 101 utilizing standard chip-on-board techniques such as wire bonding, flip chip, and flexible interconnect bonding, electrical connections 105.

Such exemplary electrical connections are represented by wire bonds or TAB bonds 105 between the horizontal sensor circuit component 102, 204 and the PCB 101 in section A of FIG. 3, solder joints 105 between the vertical sensor circuit component 103 and the PCB 101 in sections A and C of FIG. 3, and stud bumps encased in conductive epoxy 105 between the vertical sensor circuit component 103 and the PCB 101 in section B of FIG. 3. FIGS. 4–7 also exemplarily demonstrate flip chip electrical connections. Electrical connections 105 are not limited to those illustrated in the figures. In this exemplary embodiment, a sensor 102, 204 that is mounted on the X-Y plane of the PCB 101, or sensitive to magnetic fields on the plane of the PCB 101, and the vertical sensor circuit component 103 do not feature electrical connections 105 between them and are connected by a sensor component bonds 104, which can form layers between any of the sensor 102, 204, the vertical sensor circuit component 103 and the PCB 101. The sensor component bond 104 can be either non-conductive or conductive. For example, a sensor component bond 104 can be formed from a non-conductive epoxy, a conductive epoxy, or solder. The sensor component bond 104 is not intended to imply particular scaling and may be thicker or thinner than that shown in FIG. 3. As in the embodiments described above, a sensor 102, 204 that is mounted on the X-Y plane of the PCB 101 or sensitive to magnetic fields on the plane of the PCB 101 is preferably diced such that it possesses generally vertical edges along its thickness. The edge along the thickness of the sensor 102 204 serves as a support for a vertical sensor circuit component 103, which is mounted orthogonally to the sensor 102, 204 and the PCB 101.

Figure 4:
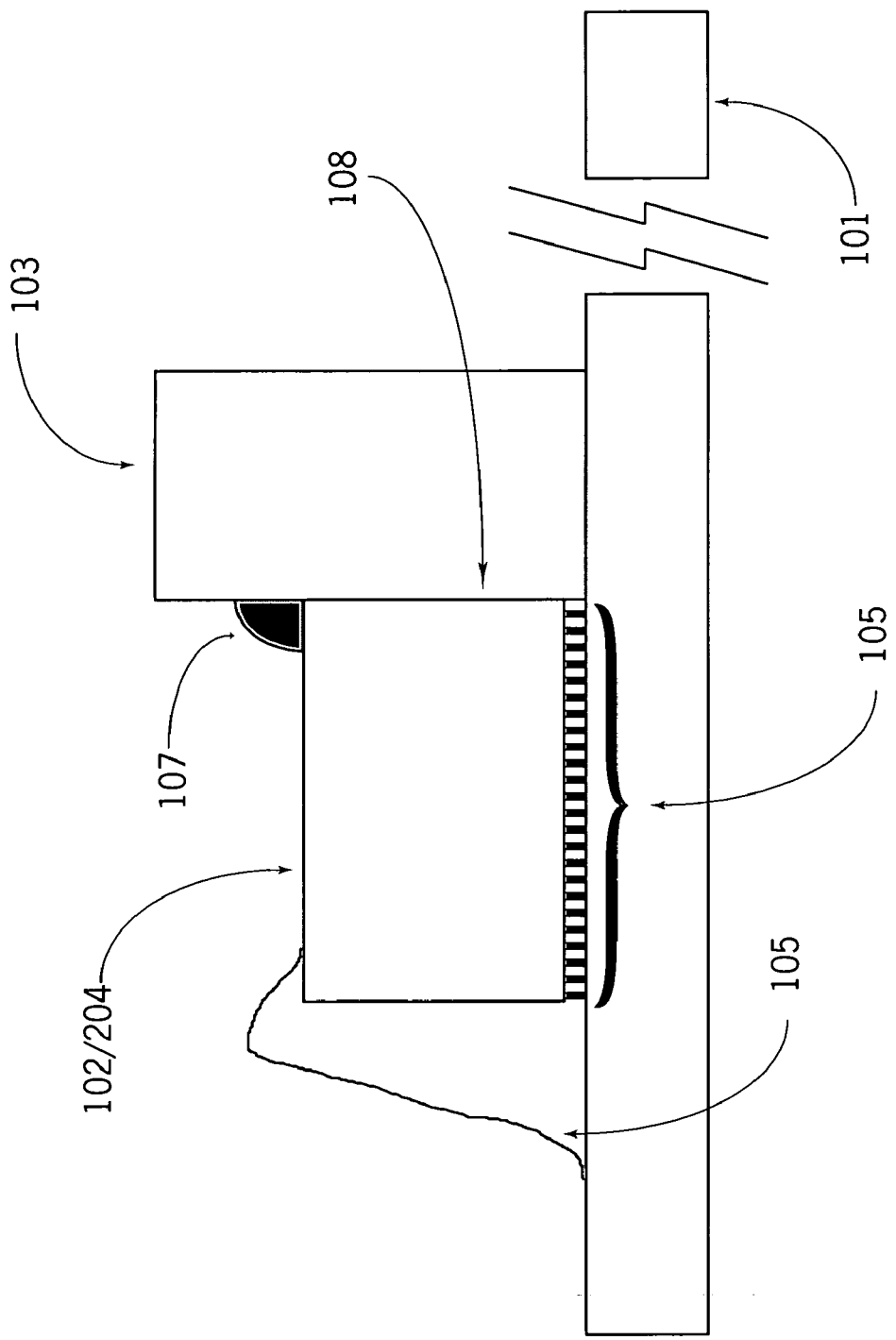
FIG. 4 is a side-view schematic diagram of a vertical die chip-on-board sensor package according to an exemplary embodiment demonstrating an alternative non-conductive bond between the sensors on the printed circuit board surface.

FIG. 4 is a side view of an alternative embodiment of the exemplary sensor package of FIG. 3. In this exemplary embodiment, a vertical sensor circuit component 103 is mounted directly against an edge of a sensor 102, 204 that is mounted horizontally, or on the X-Y plane of the PCB 101, such that the edge acts as a direct support for the vertical sensor circuit component 103. In such embodiments, the sensor 102, 204 and the vertical sensor circuit component 103 are preferably bonded by a sensor component fixture 107 (conductive or preferably non-conductive), the sensor component fixture comprising conductive epoxy, non-conductive epoxy, or other adhesive. The sensor component fixture 107 can, for example, form a bead along the interface 108 between the sensor 102, 204 and the vertical sensor circuit component 103. Exemplary electrical connections 105 are represented by both flexible interconnect bonding, such as wire bonds or TAB bonds 105 between the top face of the horizontal sensor circuit component 102, 204 and the PCB, as well as by flip chip techniques between the PCB mounting face of the horizontal sensor circuit component 102, 204 and the PCB 101. The alternate methods of electrical interconnection between the horizontal sensor circuit component and the PCB are preferably utilized separately but can be utilized simultaneously.

Figure 5:
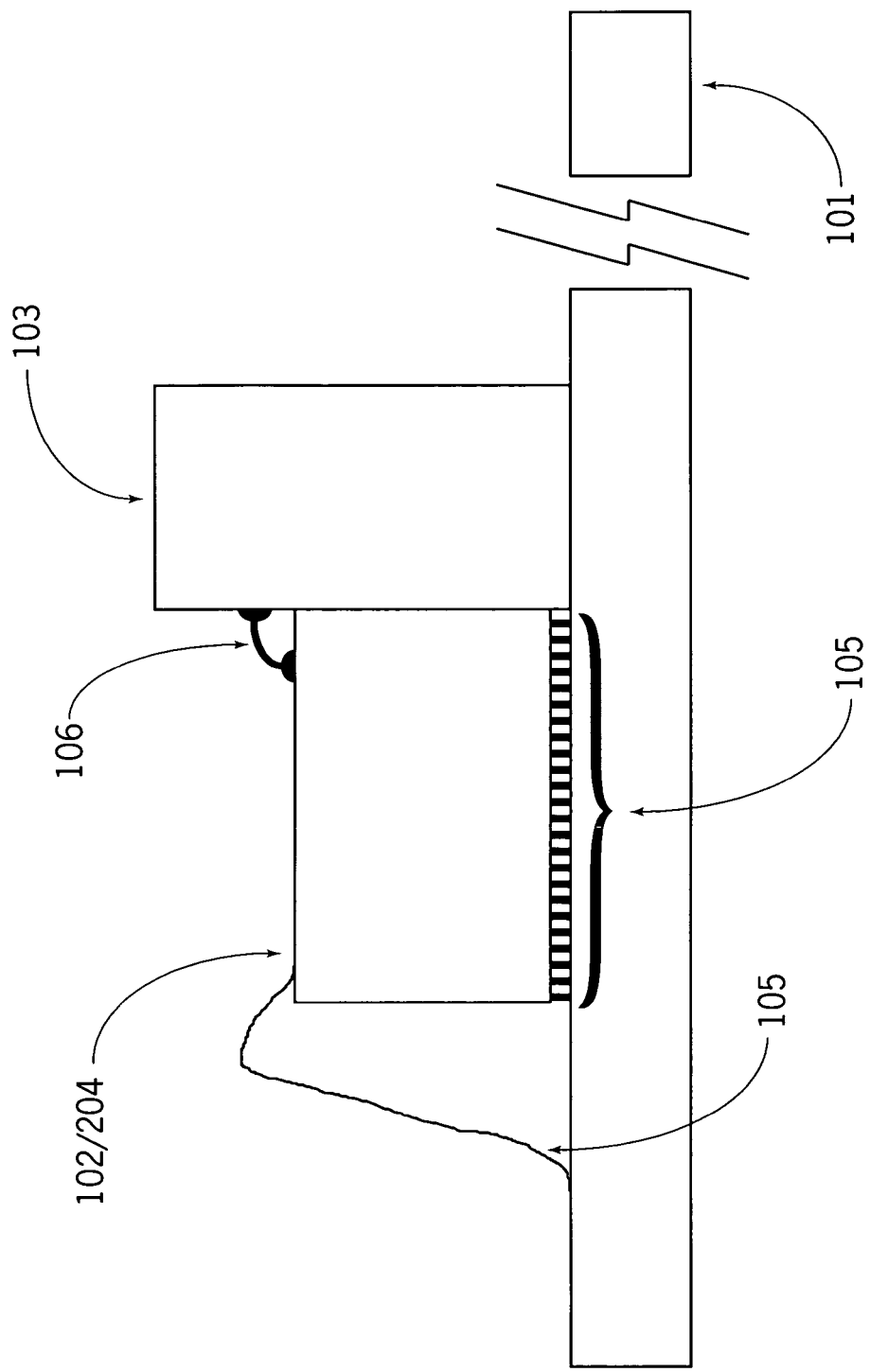
FIG. 5 is a side-view schematic diagram of a vertical die chip-on-board sensor package according to an exemplary embodiment demonstrating a conductive bond between the sensors on the printed circuit board surface.

FIG. 5 is a side view of another alternative exemplary embodiment of a vertical die chip-on-board sensor package according to the invention. FIG. 5 is analogous to the embodiment illustrated in FIG. 3, with one primary exception. FIG. 5 illustrates an embodiment wherein a sensor 102, 204 that is mounted on the X-Y plane of the PCB 101 and the vertical sensor circuit component 103 are in direct electrical communication, i.e., they feature electrical connections 106 between them. In such embodiments, both an edge of the sensor 102, 204 as well as any electrical connections 106 between them can serve as a support for the vertical sensor circuit component 103. The electrical connections between a sensor 102, 204 that is mounted on the X-Y plane of the PCB 101 and the vertical sensor circuit component 103 can be formed using standard techniques in the art, for example wire bonding, flip chip, and flexible interconnect bonding, e.g., tape automated bonding (TAB) and the like.

Figure 7:
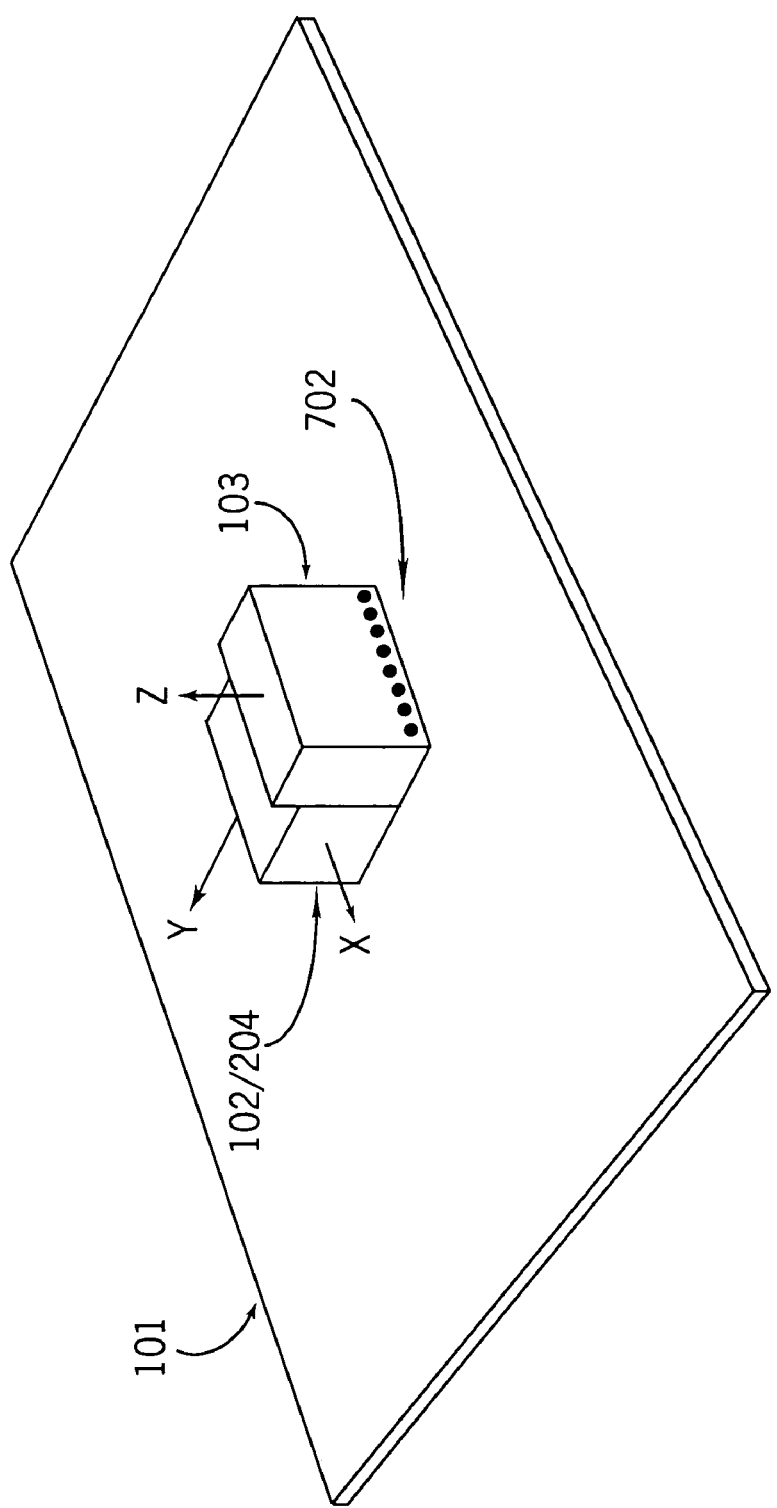
FIG. 7 is a schematic diagram of a vertical die chip-on-board sensor package according to an exemplary embodiment where an array of I/O pads is arranged on the second face of a vertical sensor circuit component orthogonal to a sensitive direction of the vertical sensor circuit component. Both the array and the sensitive direction can be arranged differently than illustrated in this exemplary embodiment.

Similarly, for embodiments such as that illustrated in section B of FIG. 2, any of the sensor components 103, 204 can be in direct electrical communication with any other sensor component to which it is abutted. While horizontal and vertical sensor circuit components can be in electrical communication with each other, the vertical sensor circuit component is preferably in electrical contact with the PCB through, for example, connections facilitated by I/O pads 702 as illustrated in FIG. 7. As with FIG. 4, exemplary electrical connections 105 are represented by both flexible interconnect bonding, such as wire bonds or TAB bonds 105 between the top face of the horizontal sensor circuit component 102, 204 and the PCB, as well as by flip chip techniques between the PCB mounting face of the horizontal sensor circuit component 102, 204 and the PCB 101. Again, the methods of electrical interconnection between the horizontal sensor circuit component and the PCB are preferably utilized separately but can be utilized simultaneously.

Figure 6:
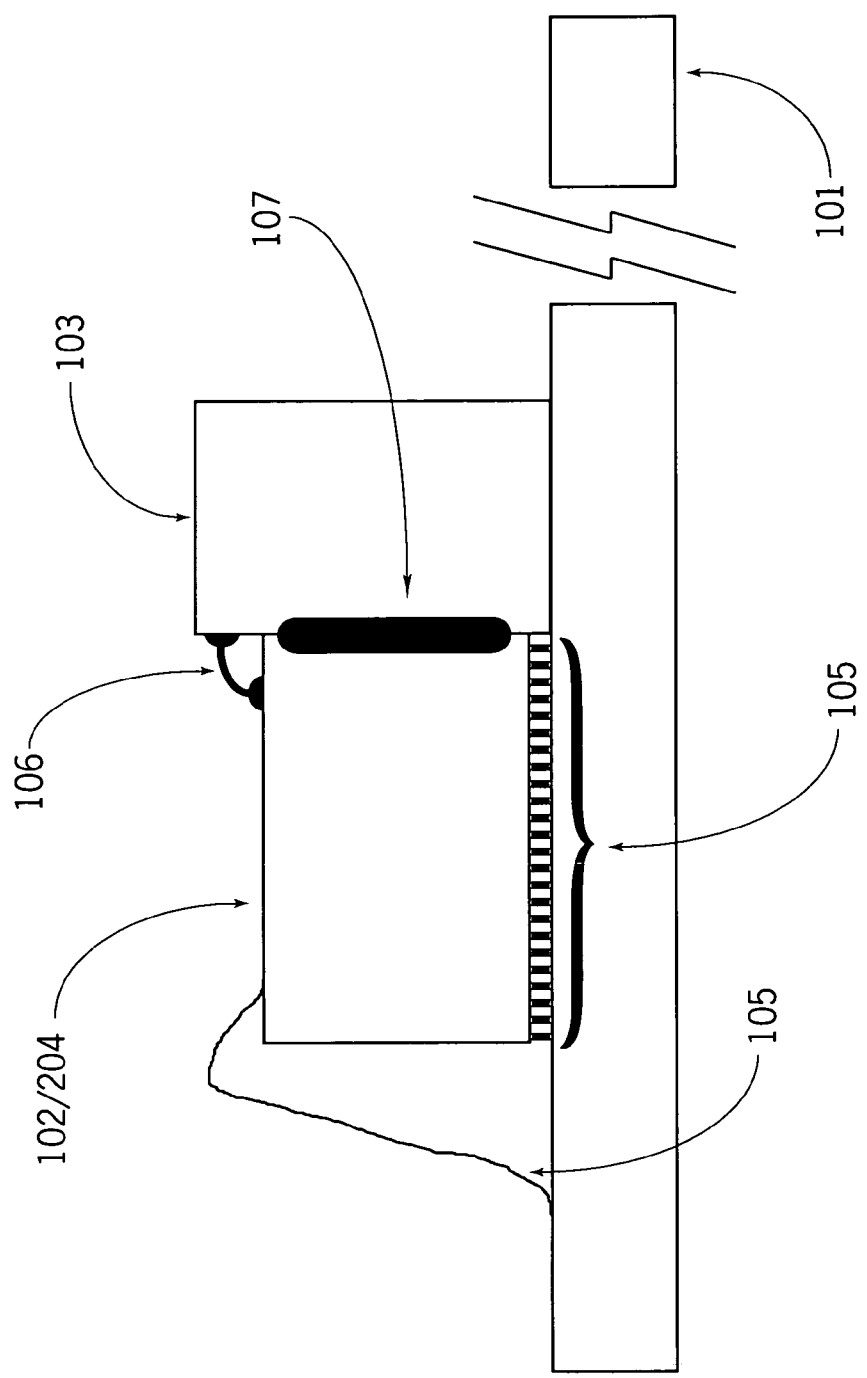
FIG. 6 is a side-view schematic diagram of a vertical die chip-on-board sensor package according to an exemplary embodiment demonstrating a conductive bond between the sensors on the printed circuit board surface with an exemplary supplemental non-conductive bond.

FIG. 6 is a side view of another alternative exemplary embodiment of a vertical die chip-on-board sensor package according to the invention. FIG. 6 is analogous to FIG. 5 with the addition of a sensor component fixture 107. Applications requiring robust sensors, for example, where sensors can be subject to large forces that could act to misalign or otherwise damage the sensors, may require greater structural integrity than is available from one or more electrical connections 106 or a sensor component bond 104. In such instances, a sensor component fixture 107 can be utilized to more adequately brace or support the vertical sensor circuit component 103 against or directly to an edge of the sensor 102, 204. The sensor component fixture 107 can be located anywhere at the interface between sensor circuit components. For example, the sensor component fixture 107 can be located along the sides of the dies as shown in FIG. 6. Alternatively, the sensor component fixture 107 can be located along an interface between a face of a horizontal sensor circuit component and an edge of a vertical sensor circuit component as illustrated in FIG. 4. In such embodiments, the sensor component fixture 107 (conductive or preferably non-conductive), comprises, for example, conductive epoxy, non-conductive epoxy, or other adhesive. The sensor component fixture 107 can form a bead along the interface 108 between the sensor 102, 204 and the vertical sensor circuit component 103.

Similarly, a sensor component fixture 107 can be utilized with embodiments such as that illustrated in section B of FIG. 2, wherein all sensor components 103, 204 are in direct electrical or non-electrical communication. As with FIGS. 4 and 5, the methods of forming electrical interconnections 105 outlined above are preferably utilized separately but can be utilized simultaneously.

FIG. 7 is a schematic diagram of an exemplary vertical die chip-on-board sensor package where an array of I/O pads 702 is arranged on the second face of a vertical sensor circuit component (analogous to section C of FIG. 3, in this exemplary case orthogonal to the sensitive direction of the vertical sensor circuit component. As stated above, the vertical sensor circuit component can be sensitive to forces along one or more axes and need not be sensitive to forces only along the Z axis. In this exemplary embodiment, the vertical and horizontal sensor circuit components can be connected as illustrated in, for example, any of FIGS. 1–6. An array of electrical contacts are positioned along the first face of the vertical sensor circuit component, in this exemplary case orthogonal to the sensing direction of the vertical sensor circuit component. In addition, though a horizontal sensor circuit component is shown that is sensitive to forces along two axes, here the X and Y axes, a horizontal sensor circuit component can also be sensitive to forces along a single axis, including the Z axis. Electrical contacts, for example, solder or stud bumps, are preferably arranged in an array and facilitate electrical connection between the vertical sensor circuit component 103 and the PCB 101.

Figure 8:
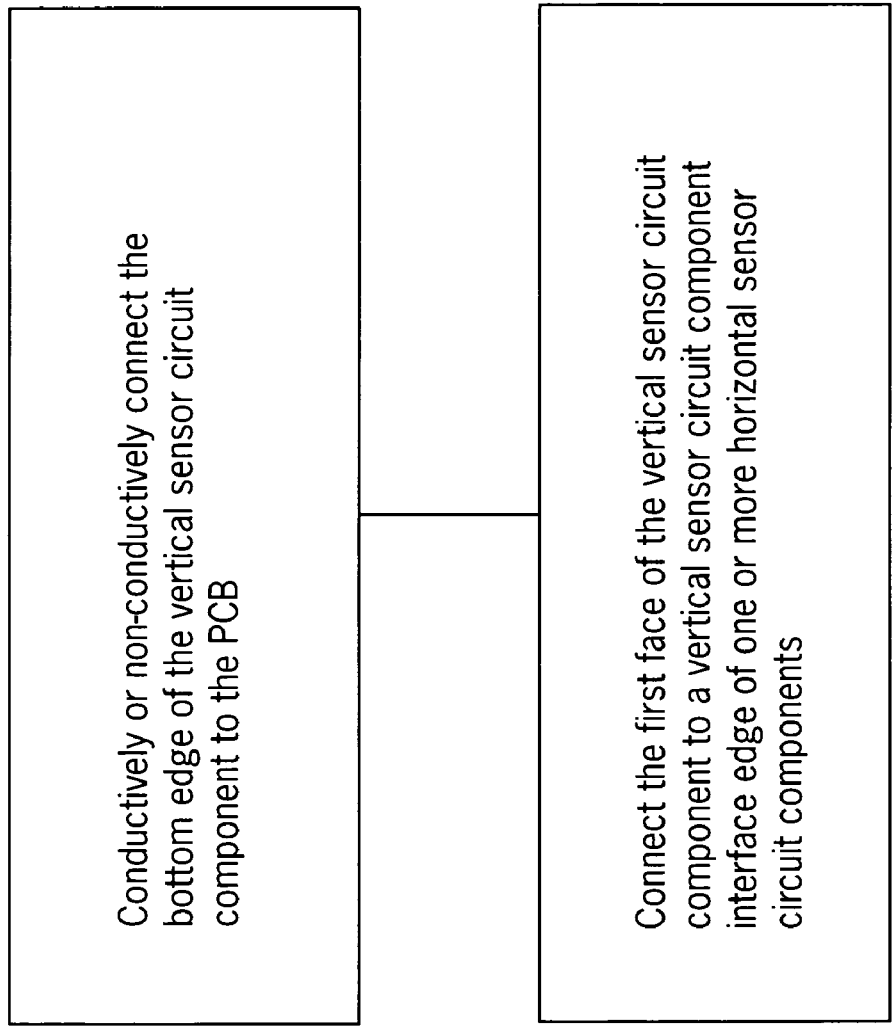
FIG. 8 is a flow chart diagram of a method of mounting a vertical sensor circuit component on a printed circuit board (PCB), according to an exemplary embodiment.

FIG. 8 is a flow chart diagram of a method of mounting a vertical sensor circuit component 103 on a PCB 101. The vertical sensor circuit component comprises a first and second face, a bottom, a top and two side edges, and I/O pads arranged on the second face proximal to the bottom edge. The bottom edge of the vertical sensor circuit component 103 is conductively or non-conductively connected to the PCB 101, which is represented by Box 1. Said vertical sensor circuit component 103 is mounted adjacent or abutted to a horizontal sensor circuit component 102, 204. Box 2 shows connecting the first face of the vertical sensor circuit component 103 to a vertical sensor circuit component interface edge of one or more horizontal sensor circuit components 102, 204, the horizontal sensor circuit components comprising a top face, a PCB mounting face, a vertical sensor circuit component interface edge, and at least two other edges. Standard chip-on-board techniques such as wire bonding, flip chip, solder bumping, stud bumping, conductive epoxy, and flexible interconnect bonding, e.g., tape automated bonding (TAB), techniques are used. The sensor 102, 204 can be mounted to the PCB 101 before or after connecting the vertical sensor circuit component 103 to the PCB 101. The result of this method of mounting a vertical sensor circuit component on a PCB 101 is that a vertical sensor circuit component interface edge of one or more horizontal sensor circuit components 102, 204 to which the sensor circuit component 103 is electrically or non-electrically connected supports the vertical sensor circuit component 103 along the Z axis. The resulting sensor package is durable and resistant to distortion of the alignment between orthogonally aligned sensing axes. The vertical sensor circuit component 103, can comprise (I/O) pads on one or more faces. The one or more sensor circuit components 103 mounted vertically on the PCB 101 and preferably one or more horizontal sensor circuit components 102, 204 are preferably diced so that the edges are substantially perpendicular to the faces.

In some embodiments, the one or more magnetic field sensing circuit components are horizontal sensor circuit components, while in other embodiments are one or more horizontal, 1-dimensional sensor circuit components. The vertical magnetic sensing circuit component can be non-conductively connected to the magnetic field sensing circuit component, and the non-conductive connection can be formed with an adhesive, such as non-conductive epoxy.

Figure 9:
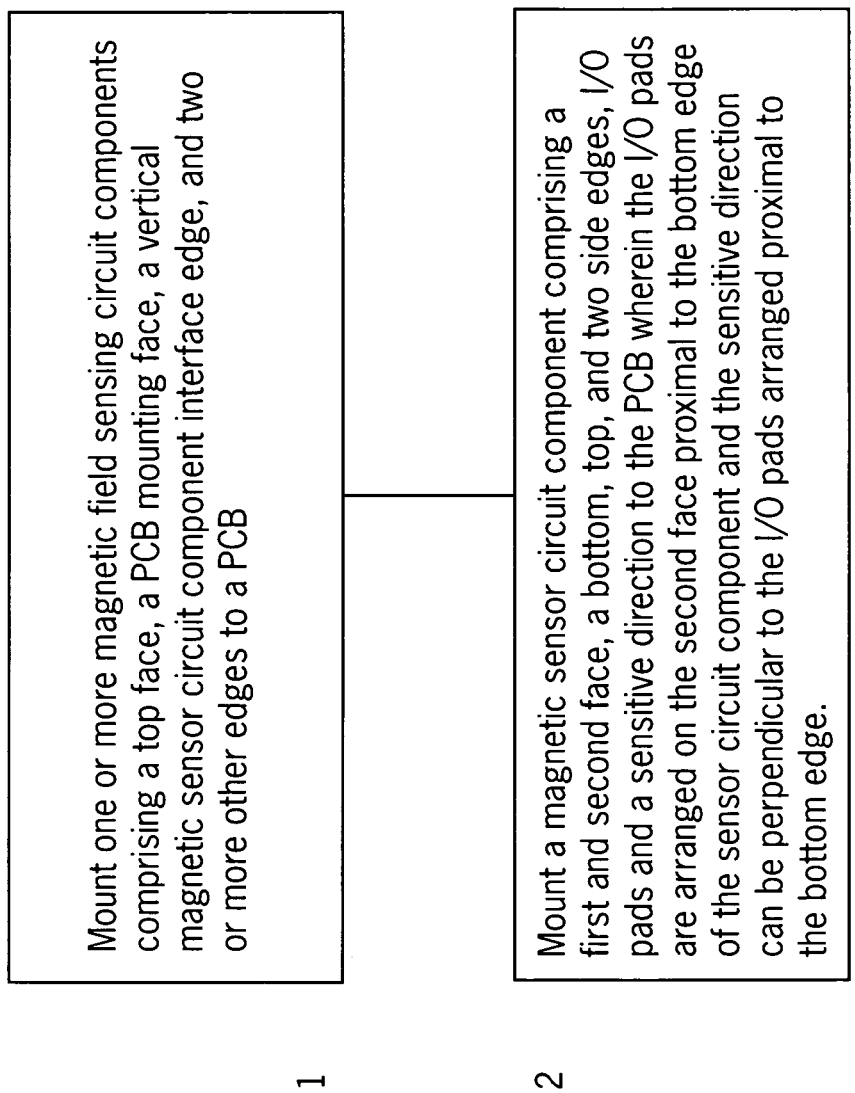
FIG. 9 is a flow chart diagram of a method of making a multi-axis magnetometer according to an exemplary embodiment.

FIG. 9 is a flow chart diagram of a method of making a multi-axis magnetometer for measuring the magnetic field intensity along three orthogonal axes. One or more magnetic field sensing circuit components 102, 204 comprising a top face, a PCB mounting face, a vertical magnetic sensor circuit component interface edge, and two or more other edges, are mounted by their PCB mounting faces to a PCB 101, as represented by Box 1. Box 2 represents mounting a magnetic sensor circuit component 103 comprising a first face, a second face, a bottom edge, a top edge, two side edges, input/output (I/O) pads and a sensitive direction to the PCB 101 wherein the I/O pads are arranged on the second face of the sensor circuit component 103, and, in this exemplary case, the sensitive direction is perpendicular to the I/O pads arranged proximal to the bottom edge. Also see FIG. 7. As described above, the sensitive direction of the vertical sensor circuit component need not be along the Z axis. Further, a vertical sensor circuit component can be sensitive to forces along more than one axis. In this method, the magnetic sensor circuit component mounted vertically 103 is attached to and supported by the magnetic field sensing circuit component mounted horizontally 102, 204. The vertically-mounted magnetic sensing circuit component 103 can be non-conductively connected to the one or more magnetic field sensing circuit components 102, 204 with an adhesive, preferably non-conductive epoxy.

In some embodiments, the one or more magnetic field sensing circuit components are horizontal sensor circuit components (i.e., 2-dimensional sensors sensitive to forces along any two of the X, Y and/or Z axes), while in other embodiments are one or more horizontal, 1-dimensional sensor circuit components, sensitive to forces along one axis. The vertical magnetic sensing circuit component can be non-conductively connected to the magnetic field sensing circuit component, and the non-conductive connection can be formed with an adhesive, such as non-conductive epoxy.

In addition, the vertically-mounted magnetic sensing circuit component 103 can comprise I/O pads on its first face and the one or more magnetic field sensing circuit components 102, 204 comprise I/O pads on, for example, their top face, and the vertical magnetic sensing circuit component and the one or more magnetic field sensing circuit components can be conductively connected by the I/O pads. See also FIG. 6. The conductive connection between the vertical magnetic sensing circuit component and the one or more magnetic field sensing circuit components can be formed by, for example, wire bonding, flip chip, solder bumping, stud bumping, conductive epoxy, and flexible interconnect bonding, e.g., tape automated bonding (TAB), techniques.

In preferred embodiments of the above aspects of the invention, the vertical sensor circuit component 103 is low-profile, i.e., equal to or less than about 1.1 mm in height. Further, the figures represent exemplary embodiments and do not limit the vertical die chip-on-board sensor package methods and sensor packages of the invention to magnetic sensors. Another sensor type that can be substituted for the magnetic sensors in the figures can be, for example, tilt sensors or any other sensor that can be utilized with PCB processes and are of a small size, preferably about or less than 1.1 mm in height. The vertical die chip-on-board sensor packages of the invention and the methods of making said vertical die chips-on-board sensor packages can be included in electronic devices, including portable and hand held devices, such as cell phones.

More generally speaking, a magnetic field can be characterized as a vector quantity that has both magnitude and direction. Magnetic sensors measure this quantity in various ways. Some magnetometers measure total magnitude but not direction of the field (scalar sensors). Others measure the magnitude of the component of magnetization, which is along their sensitive axis (omni-directional sensors). This measurement may also include direction (bi-directional sensors). Vector magnetic sensors can have 2 or 3 bi-directional sensors. Some magnetic sensors have a built in threshold and produce an output only when that threshold is passed. While the types of magnetic sensors that can be utilized in the present invention include older techniques including reed switches, variable reluctance sensors, flux-gate magnetometers, magneto-inductive sensors, and Hall devices, the relatively new solid-state sensors such as Anisotropic Magnetoresistive (AMR) Sensors are preferred due to their adaptability to PCB processes and small size. The present invention relates vertical die chip-on-board sensor packages made with any combination of the sensors mentioned above, and preferably AMR sensors. Said sensor packages utilize the vertical die chip-on-board methods described herein in their manufacture.

The Earth's magnetic field can be exploited to determine, for example, compass headings for navigation and yaw rate (by measuring the derivative of the change in field). AMR sensors provide an excellent means of measuring both linear and angular position and displacement in the Earth's magnetic field as they can sense DC static fields as well as the strength and direction of the field. AMR sensors are generally made of a nickel-iron (Permalloy) thin film deposited on a silicon wafer and patterned as a resistive strip. The properties of the AMR thin film cause it to change resistance by about 2–3% in the presence of a magnetic field. Typically, four of these resistors are connected in a Wheatstone bridge configuration so that both magnitude and direction of a field along a single axis can be measured. For typical AMR sensors, the bandwidth is in the 1–5 MHz range. The reaction of the magnetoresistive effect is fast and not limited by coils or oscillating frequencies. Other benefits of AMR sensors are that they are of low cost, high sensitivity, small size, high reliability, possess significant noise immunity, and they can be bulk manufactured on silicon wafers and mounted in commercial integrated circuit packages. This allows magnetic sensors to be auto-assembled with other circuit and systems components. AMR sensors are available from, for example, Honeywell.

The present invention also relates to the utilization of additional types of sensor (other than magnetic sensors) with the vertical die chip-on board sensor package methods of the invention to produce vertical die chip-on-board sensor packages of various functions. As an example, tilt sensors can be used in conjunction with magnetic sensors to provide navigation and vehicle attitude information. Aircraft convention defines the attitude parameters in terms of three angles: heading, pitch and roll. These angles are referenced to the local horizontal plane. That is, the plane perpendicular to the earth's gravitational vector. Heading is defined as the angle in the local horizontal plane measured clockwise from true North (earth's polar axis). Pitch is defined as the angle between the aircraft's longitudinal axis and the local horizontal plane (positive for nose up). Roll is defined as the angle about the longitudinal axis between the local horizontal plane and the actual flight orientation (positive for right wing down). Methods of determining heading, pitch and roll from tilt sensor output are well known in the art.

Common tilt measuring devices include accelerometers, electrolytic (fluid) based tilt sensors, and gimbaled mechanical structures. Another method to determine the local horizontal plane is to use a gyroscope to maintain a known inertial reference orientation at all times. Tilt sensors that can be adapted for use with PCB processes and can be of small size, for example accelerometers and electrolytic sensors, are preferred tilt sensors. Said tilt sensors can be mounted to a PCB according to the invention.

Low cost tilt sensors like the two-axis electrolytic and dual axis accelerometer measure the roll and pitch angle directly. Liquid filled electrolytic tilt sensors, resembling a glass "thimble", use electrodes to monitor the fluid movement as the sensor changes angles. Solid-state accelerometer tilt sensors measure the Earth's gravitational field by means of an electromechanical circuit. These sensors are similar in that they have two single axis components that measure the angle deviations from the local horizontal plane. Signal conditioning circuits are used to create an output signal proportional to the angle of tilt. These sensor types are considered strapdown devices since they have no moving or pendulous parts. If a strapdown compass is required to output heading for any orientation then, as a minimum, a compass system must have a three-axis magnetic sensor and a two-axis tilt. The heading calculation relies on all three magnetic components (X,Y,Z) so the compass orientation can be mathematically rotated to the horizontal plane. Then, the Xh and Yh (the horizontal components of the Earth's magnetic field) components can be calculated to determine the heading value.

Therefore, the present invention fills a need for mounting sensors orthogonally to other sensors mounted in the plane of a printed circuit board, said orthogonally mounted sensors measuring forces or magnetic fields on the Z-axis. In particular, the instant invention provides methods for mounting orthogonal sensors in a low profile manner in, for example, cell phone and other consumer and commercial applications, which methods are cost sensitive, high volume, and easily adaptable to common PCB assembly processes.

It should be understood that the illustrated embodiments are exemplary only and should not be taken as limiting the scope of the present invention. The claims should not be read as limited to the described order or elements unless stated to that effect. Therefore, all embodiments that come within the scope and spirit of the following claims and equivalents thereto are claimed as the invention.

We claim:

1. A sensor package comprising:
    a) a vertical sensor circuit component comprising a first face, a second face, a bottom edge, a top edge, two side edges, input/output (I/O) pads and at least one sensitive direction wherein the I/O pads are arranged on the second face of the vertical sensor circuit component; and
    b) a horizontal sensor circuit component comprising a top face, a printed circuit board (PCB) mounting face, a vertical sensor circuit component interface edge, at least two or more other edges, and at least one sensitive direction orthogonal to the sensitive directions of the vertical sensor circuit component,
    wherein the vertical sensor circuit component interface edge of the horizontal sensor circuit component connectively supports the vertical sensor circuit component along the Z axis; and
    wherein the first face comprises I/O pads for conductive connection to the horizontal sensor circuit component.

2. The sensor package of claim 1 wherein the distance between the bottom edge and the top edge of the vertical sensor circuit component is about 1.1 mm.

3. The sensor package of claim 1 wherein the distance between the bottom edge and the top edge of the vertical sensor circuit component is less than about 1.1 mm.

4. The sensor package of claim 1 wherein the I/O pads on the vertical sensor circuit component are arranged in an array.

5. The sensor package of claim 1 wherein the I/O pads on the vertical sensor circuit component are compatible with a method selected from the group consisting of wire bonding, flip chip, solder bumping, stud bumping, conductive epoxy, flexible interconnect bonding, and tape automated bonding (TAB) techniques.

6. The vertical sensor circuit component of claim 1 wherein the I/O pads are compatible with a method selected from the group consisting of wire bonding, flip chip, solder bumping, stud bumping, conductive epoxy, flexible interconnect bonding, and tape automated bonding (TAB) techniques.

7. The sensor package of claim 1 wherein the vertical sensor circuit component and the horizontal sensor circuit component are solid state sensors.

8. The sensor package of claim 1 wherein the vertical sensor circuit component and the horizontal sensor circuit component are magnetic sensors.

9. The sensor package of claim 1 wherein the vertical sensor circuit component and the horizontal sensor circuit component are tilt sensors.

10. The sensor package of claim 1 wherein the vertical sensor circuit component comprises a sensor and the horizontal sensor circuit component comprises a solid state chip with the vertical sensor circuit component interface edge.

11. A sensor package comprising:
    a) a vertical sensor circuit component comprising a first face, a second face, a bottom edge, a top edge, two side edges, input/output (I/O) pads and at least one sensitive direction wherein the I/O pads are arranged on the second face of the vertical sensor circuit component; and
    b) a horizontal sensor circuit component comprising a top face, a printed circuit board (PCB) mounting face, a vertical sensor circuit component interface edge, at least two or more other edges, and at least one sensitive direction orthogonal to the sensitive directions of the vertical sensor circuit component,
    wherein the vertical sensor circuit component interface edge of the horizontal sensor circuit component connectively supports the vertical sensor circuit component alone the Z axis; and
    wherein the vertical sensor circuit component is conductively connected to the horizontal sensor circuit component.

12. A method for mounting a vertical sensor circuit component with a first and second face, a bottom, a top and two side edges, and I/O pads arranged on the second face to a PCB comprising:
    a) connecting the bottom edge of the vertical sensor circuit component to the PCB; and
    b) connecting the first face of the vertical sensor circuit component to a vertical sensor circuit component interface edge of one or more horizontal sensor circuit components comprising a top face, a PCB mounting face, a vertical sensor circuit component interface edge, and at least two other edges, wherein the horizontal sensor circuit component is connected to the PCB;
    wherein the vertical sensor circuit component interface edge of the horizontal sensor circuit component to which the vertical sensor circuit component is connected supports the vertical sensor circuit component along the Z axis.

13. The method of claim 12 wherein the vertical sensor circuit component is conductively connected to the PCB by a method selected from the group consisting of wire bonding, flip chip, solder bumping, stud bumping, conductive epoxy, flexible interconnect bonding, and tape automated bonding (TAB) techniques.

14. The method of claim 13 wherein the vertical sensor circuit component is conductively connected to the PCB by conductive epoxy, solder bumping or stud bumping techniques.

15. The method of claim 12 wherein the vertical sensor circuit component and the one or more horizontal sensor components are diced wherein the edges are substantially perpendicular to the faces.

16. A method for making a multi-axis magnetometer for measuring the magnetic field intensity along at least two orthogonal axes comprising:
    a) mounting one or more magnetic field sensing circuit components comprising a top face, a PCB mounting face, a vertical magnetic sensor circuit component interface edge, and two or more other edges, by their PCB mounting face to a PCB; and
    b) mounting to the PCB a vertical magnetic sensor circuit component comprising a first face, a second face, a bottom edge, a top edge, two side edges, input/output (I/O) pads and at least one sensitive direction wherein the I/O pads are arranged on the second face of the vertical sensor circuit component;
    wherein the vertical magnetic sensor circuit component is attached to and supported by the at least one magnetic field sensing circuit component; and wherein the vertical magnetic sensing circuit component is conductively connected to the magnetic field sensing circuit component.

17. The method of claim 16 wherein the magnetic field sensing circuit component is one or more horizontal sensor circuit components.

18. The method of claim 16 wherein the magnetic field sensing circuit component is one or more horizontal, 1-dimensional sensor circuit components.

19. The method of claim 16 wherein the conductive connection is formed with an adhesive.

20. The method of claim 19 wherein the adhesive is conductive epoxy.

21. A multi-axis magnetometer for measuring the magnetic field intensity along at least two orthogonal axes produced according to the method of claim 16.

22. The multi-axis magnetometer for measuring the magnetic field intensity along three orthogonal axes of claim 21, further comprising a tilt sensor.

23. The multi-axis magnetometer for measuring the magnetic field intensity along three orthogonal axes of claim 21 wherein the vertical magnetic sensor circuit component is about 1.1 mm in height above the PCB.

24. The multi-axis magnetometer for measuring the magnetic field intensity along three orthogonal axes of claim 22 wherein the vertical magnetic sensor circuit component is about 1.1 mm in height above the PCB.

25. The multi-axis magnetometer for measuring the magnetic field intensity along three orthogonal axes of claim 21 wherein the vertical magnetic sensor circuit component is less than about 1.1 mm in height above the PCB.

26. The multi-axis magnetometer for measuring the magnetic field intensity along three orthogonal axes of claim 22 wherein the vertical magnetic sensor circuit component is less than about 1.1 mm in height above the PCB.

27. A sensor package comprising:
   a) a vertical sensor circuit component comprising a first face, a second face, a bottom edge, a top edge, two side edges, input/output (I/O) pads and at least one sensitive direction wherein the I/O pads are arranged on the second face of the vertical sensor circuit component; and
   b) a horizontal sensor circuit component comprising a top face, a printed circuit board (PCB) mounting face, a vertical sensor circuit component interface edge, at least two or more other edges, and at least one sensitive direction orthogonal to the sensitive directions of the vertical sensor circuit component, wherein the horizontal sensor circuit component is connected to the PCB,
   wherein the vertical sensor circuit component interface edge of the horizontal sensor circuit component connectively supports the vertical sensor circuit component along the Z axis.

28. The sensor package of claim 27 wherein the vertical sensor circuit component is non-conductively connected to the horizontal sensor circuit component.

29. The sensor package of claim 28 wherein the non-conductive connection is formed with an adhesive.

30. The sensor package of claim 29 wherein the adhesive is non-conductive epoxy.

31. The sensor package of claim 27 wherein the vertical sensor circuit component is conductively connected to the horizontal sensor circuit component.

* * * * *

UNITED STATES PATENT AND TRADEMARK OFFICE
CERTIFICATE OF CORRECTION

PATENT NO. : 7,095,226 B2  
APPLICATION NO. : 10/789682  
DATED : August 22, 2006  
INVENTOR(S) : Hong Wan et al.

Page 1 of 1

It is certified that error appears in the above-identified patent and that said Letters Patent is hereby corrected as shown below:

On the title page, at item [57], please delete: "Methods and apparatus for vertical chip-on-board sensor packages..." and replace with -- Methods and apparatus for vertical die chip-on-board sensor packages.... --

In claim 11, Column 14, line 14, please delete "alone" and substitute -- along --.

Signed and Sealed this

Eighteenth Day of September, 2007

JON W. DUDAS  
*Director of the United States Patent and Trademark Office*